United States Patent
Hobart et al.

(10) Patent No.: US 9,305,858 B2
(45) Date of Patent: Apr. 5, 2016

(54) NANOCRYSTALLINE DIAMOND THREE-DIMENSIONAL FILMS IN PATTERNED SEMICONDUCTOR SUBSTRATES

(71) Applicants: Karl D. Hobart, Alexandria, VA (US); Marko J. Tadjer, Springfield, VA (US); Tatyana I. Feygelson, Springfield, VA (US); Bradford B. Pate, Arlington, VA (US); Travis J. Anderson, Alexandria, VA (US)

(72) Inventors: Karl D. Hobart, Alexandria, VA (US); Marko J. Tadjer, Springfield, VA (US); Tatyana I. Feygelson, Springfield, VA (US); Bradford B. Pate, Arlington, VA (US); Travis J. Anderson, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 14/820,750

(22) Filed: Aug. 7, 2015

(65) Prior Publication Data
US 2015/0348866 A1    Dec. 3, 2015

Related U.S. Application Data

(63) Continuation of application No. 14/211,247, filed on Mar. 14, 2014, now Pat. No. 9,159,641.

(60) Provisional application No. 61/787,019, filed on Mar. 15, 2013.

(51) Int. Cl.
*H01L 29/00*    (2006.01)
*H01L 29/06*    (2006.01)
*G12B 21/02*    (2006.01)
(Continued)

(52) U.S. Cl.
CPC .......... *H01L 23/3732* (2013.01); *H01L 23/367* (2013.01); *H01L 23/481* (2013.01); *H01L 29/1602* (2013.01); *H01L 29/7786* (2013.01); *H01L 21/02381* (2013.01); *H01L 21/02527* (2013.01); *H01L 21/02645* (2013.01); *H01L 23/3677* (2013.01); *H01L 29/0657* (2013.01);
(Continued)

(58) Field of Classification Search
CPC ..................... H01L 23/3732; H01L 21/02527; H01L 21/0262; H01L 21/0264
USPC .......... 438/167, 172, 496, 584; 257/194, 499, 257/618, 798
See application file for complete search history.

(56) References Cited

U.S. PATENT DOCUMENTS 7,595,507 B2    9/2009    Francis et al.
7,745,848 B1    6/2010    Rajagopal et al.
(Continued)

OTHER PUBLICATIONS

O.A. Williams, "Nanocrystalline Diamond," Diamond & Related Materials vol. 20 (2011) 621-640.
(Continued)

*Primary Examiner* — Hsien Ming Lee
(74) *Attorney, Agent, or Firm* — US Naval Research Laboratory; Joslyn Barritt

(57) ABSTRACT

An array of through-silicon vias (TSVs) are formed in a silicone substrate. The vias can be tapered such that the diameter of the via at the surface of the substrate is larger than the diameter of the via at its bottom, with the diameter varying continuously along its depth. After the via is formed, it is seeded with a thin layer of nanocrystalline diamond (NCD) particles, and a NCD film is grown on the bottom and along the sidewalls of the via. The presence of the diamond-filled vias provides improved thermal management to semiconductor devices formed on the silicon substrate.

20 Claims, 7 Drawing Sheets

(51) Int. Cl.
  H01L 23/373 (2006.01)
  H01L 29/778 (2006.01)
  H01L 29/16 (2006.01)
  H01L 23/367 (2006.01)
  H01L 23/48 (2006.01)
  H01L 21/02 (2006.01)
  H01L 29/20 (2006.01)

(52) U.S. Cl.
  CPC ..... *H01L 29/2003* (2013.01); *H01L 2924/0002* (2013.01)

(56) References Cited

U.S. PATENT DOCUMENTS

| | | |
|---|---|---|
| 7,989,925 B2 | 8/2011 | Cheng et al. |
| 8,039,301 B2 | 10/2011 | Kub et al. |
| 8,236,584 B1 | 8/2012 | Chem et al. |
| 8,283,189 B2 | 10/2012 | Francis et al. |
| 8,283,672 B2 | 10/2012 | Francis et al. |
| 8,445,383 B2 | 5/2013 | Hobart et al. |
| 2002/0117695 A1 | 8/2002 | Borges et al. |
| 2007/0220959 A1 | 9/2007 | Sumant et al. |
| 2009/0148652 A1 | 6/2009 | Carlisle et al. |
| 2009/0208666 A1 | 8/2009 | Wort et al. |
| 2013/0193585 A1 | 8/2013 | Lin et al. |

OTHER PUBLICATIONS

J.E. Butler and A.V. Sumant, "The CVD of Nanodiamond Materials," Chem. Vap. Deposition 2008, 14, 145-160.

M.J. Tadjer, T.J. Anderson, K.D. Hobart, T.I. Feygelson, J.D. Caldwell, C.R. Eddy, Jr., F.J. Kub, J.E. Butler, B. Pate, and J. Melngailis, Reduced Self-Heating in AlGaN/GaN HEMTs Using Nanocrystalline Diamond Heat-Spreading Films, IEEE Electron Device Letters., vol. 33, No. 1, pp. 23-25 (2012).

K.D. Chabak, J.K. Gillespie, V. Miller, A. Crespo, J. Roussos, M. Trejo, D.E. Walker, Jr., G.D. Via, G.H. Jessen, J. Wasserbauer, F. Faili, D.I. Babic, D. Francis, and F. Ejeckam, "Full-wafer characterization of AlGaN/GaN HEMTs of freestanding CVD diamond substrates," IEEE Electron Device Letters, vol. 31, No. 2, pp. 99-101, Feb. 2010.

K. Hirama, M. Kasu, and Y. Taniyasu, "RF High-Power Operation of AlGaN/GaN HEMTs Epitaxially Grown on Diamond," IEEE Electron Device Letters, vol. 33, No. 4, pp. 513, 2012.

M. Seelman-Eggebert, P. Meisen, F. Schaudel, P. Koidl, A. Vescan, and H. Leier, "Heat-spreading diamond films for GaN-based high-power transistor devices," Diamond and Related Materials, vol. 10, No. 3-7, pp. 744-749, 2001.

Z. Yan, G. Liu, J.M. Khan, and A.A. Balandin, "Graphene quilts for thermal management of high-power GaN transistors," Nature Communications 3, 827, 2012.

T.I. Feygelson, T.J. Anderson, M. P. Ray, K.D. Hobart, and B.R. Pate, "Detonation versus laser-synthesized nanodiamond powders for seeding" 22nd European Conference on Diamond, Diamond-Like Materials, Carbon Nanotubes and Nitrides, Garmisch-Partenkirchen, Germany, 2011.

K.D. Hobart et al., International Conference on Diamond and Carbon Materials, Granada, Spain, 2012.

N. Ranganathan, L. Ebin, L. Linn, L. W. S. Vincent, O. K. Navas, V. Kripesh, and N. Balasubramanian, "Integration of High Aspect Ratio Tapered Silicon Via for Silicon Carrier Fabrication," IEEE Trans. on Adv. Packaging, vol. 32, No. 1, pp. 62, 2009.

M. Azize and T. Palacios, "Effect of substrate-induced strain in the transport properties of AlGaN/GaN heterostructures," J. Appl. Phys. 108, 023707 (2010).

T.J. Anderson, K.D. Hobart, M.J. Tadjer, T.I. Feygelson, E.A. Imhoff, D.J. Meyer, D.S. Katzer, J.K. Hite, F.J. Kub, B.B. Pate, S.C. Binari, and C.R. Eddy, Jr., "Improved GaN-based HEMT Performance by Nanocrystalline Diamond Capping," Device Research Conference Digest, pp. 155-156, 2012.

A. Wang, M.J. Tadjer, T.J. Anderson, R. Baranyai, J. Pomeroy, T.I. Feygelson, K.D. Hobart, B.B. Pate, F. Calle, and M. Kuball, "Impact of Intrinsic Stress in Diamond Capping Layers on the Electrical Behavior of AlGaN/GaN HEMTs," IEEE Trans. Electr. Dev., vol. 60, No. 10, pp. 3149-3156, 2013.

Search Report and Written Opinion in Corresponding International Application No. PCT/US2014/027515 (WO2014152598).

NANOCRYSTALLINE DIAMOND THREE-DIMENSIONAL FILMS IN PATTERNED SEMICONDUCTOR SUBSTRATES

CROSS-REFERENCE

This application is a continuation of, and claims the benefit of priority under 35 U.S.C. §120 based on, U.S. patent application Ser. No. 14/211,247 filed on Mar. 14, 2014, which in turn is a Nonprovisional of, and claims the benefit of priority under 35 U.S.C. §119 based on, U.S. Provisional Patent Application No. 61/787,019 filed on Mar. 15, 2013, each of which is hereby incorporated by reference into the present application in their entirety.

TECHNICAL FIELD

The present invention relates to the development of diamond-filled through-silicon vias (TSVs), particularly to the growth of nanocrystalline diamond in such via structures.

BACKGROUND

Thermal concerns in semiconductor integrated circuits or discrete power devices need a solution for efficient heat transfer from the vicinity of the transistor channel, where hot electrons are generated.

Efficient thermal management by means of a high-thermal conductivity path through the substrate of a GaN-on-Si HEMT requires several considerations. Providing such a path by growth of GaN device layers on SiC substrates has been the most widespread practice. Excellent power device performance has been obtained by multiple research groups. However, thermal considerations cannot be completely mitigated by this approach due to the large thermal boundary resistance between the SiC substrate and the GaN nucleation layers. As a result, device engineers have faced a dilemma: power performance has been either curtailed in order to improve reliability, or maximized at the expense of optimal reliability.

Nanocrystalline diamond (NCD) has been of interest for a number of applications owing to its attractive properties such as high thermal conductivity, optical transparency, hardness, and inertness, among others. See O. A. Williams, *Diamond & Related Materials* Vol. 20 (2011) 621-640; see also J. E. Butler and A. V. Sumant, *Chem. Vap. Deposition* 2008, 14, 145-160.

For applications requiring a thin NCD film (e.g., AFM tip coatings, heat spreaders), NCD films having a thickness of less than 1 µm are typically grown with rms roughness in the 20-100 nm range. See Butler, supra; see also M. J. Tadjer, T. J. Anderson, K. D. Hobart, Tatyana I. Feygelson, Joshua D. Caldwell, Charles R. Eddy, Jr., Fritz J. Kub, James E. Butler, Bradford Pate, and John Melngailis, "Reduced Self-Heating in AlGaN/GaN HEMTs Using Nanocrystalline Diamond Heat-Spreading Films, *IEEE Electron Device Letters.*, Vol. 33, No. 1, pp. 23-25 (2012) ("Tadjer et al., 2012"), which shares several authors in common with the present inventors, and which is hereby incorporated by reference into the present disclosure in its entirety.

Several groups have demonstrated GaN devices on polycrystalline or single-crystal diamond substrates.

For example, one approach involves III-Nitride growth on a large-area CVD diamond substrate growth. See, e.g. K. D. Chabak, J. K. Gillespie, V. Miller, A. Crespo, J. Roussos, M. Trejo, D. E. Walker, Jr., G. D. Via, G. H. Jessen, J. Wasserbauer, F. Faili, D. I. Babic, D. Francis, and F. Ejeckam, "Full-wafer characterization of AlGaN/GaN HEMTs of free-standing CVD diamond substrates," *IEEE Electron Device Letters*, vol. 31, no. 2, pp. 99-101, February 2010. However, in this approach, substrate development may be incompatible with a CMOS process, and issues such as wafer bow have to be overcome.

III-Nitride structures have also been grown on a small-area, high quality single crystal diamond substrate. See K. Hirama, M. Kasu, and Y. Taniyasu, "RF High-Power Operation of AlGaN/GaN HEMTs Epitaxially Grown on Diamond," *IEEE Electron Device Letters*, vol. 33, no. 4, pp. 513, 2012. However, the small substrate size required in this approach is incompatible with cost-effective device solutions, and is also incompatible with CMOS devices.

In another approach, a thin CVD diamond layer has been grown mid-process during III-Nitride device fabrication. See Tadjer et al., 2012, supra. Although the heat spreading layer in such an artifact can be very efficient due to its proximity to the heat source, advanced process development techniques need to be developed to avoid damaging the surface of the III-Nitride material. In addition, the diamond thickness relative to the rest of the transistor layers may be prohibitive to device scaling.

Others have investigated the growth of a thin CVD diamond cap on a fabricated III-Nitride device. See M. Seelman-Eggebert, P. Meisen, F. Schaudel, P. Koidl, A. Vescan, and H. Leier, "Heat-spreading diamond films for GaN-based high-power transistor devices," *Diamond and Related Materials*, Vol. 10, no. 3-7, pp. 744-749, 2001. However, gate performance can degrade in such devices due to exposure of high temperature during CVD diamond growth.

Finally, some have utilized deposition of heat spreading materials other than diamond in the vicinity of a III-Nitride device. One material that has been used is graphene. See Z. Yan, G. Liu, J. M. Khan, and A. A. Balandin, "Graphene quilts for thermal management of high-power GaN transistors," *Nature Communications* 3, 827, 2012. However, graphene is electrically conductive as well as thermally conductive, and so must be placed away from the device in order to avoid the introduction of parasitic current leakage paths.

Recent improvements in substrate surface preparation have enabled the exploration of NCD growth in vertically etched cavities. See T. I. Feygelson, T. J. Anderson, M. P. Ray, K. D. Hobart, and B. R. Pate, "Detonation versus laser-synthesized nanodiamond powders for seeding" 22*nd European Conference on Diamond, Diamond-Like Materials, Carbon Nanotubes and Nitrides*, Garmisch-Partenkirchen, Germany, 2011; and K. D. Hobart et al., *International Conference on Diamond and Carbon Materials*, Granada, Spain, 2012.

Metal-filled TSVs have been employed in advanced interconnect applications such as off-chip interconnect in multi-chip modules. TSVs coated or filled with NCD have the potential of providing electrically insulating thermal paths across semiconductor surfaces, and thus are of interest in semiconductor device thermal management applications.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present disclosure provides an article of manufacture comprising at nanocrystalline diamond-coated vias in a silicone substrate and further provides methods for forming the same.

One or more through-silicon vias (TSVs) are formed in a silicone substrate. The vias are tapered such that the diameter of the via at the surface of the substrate is larger than the diameter of the via at its bottom within the interior of the substrate, with the diameter of the via varying continuously along its depth. After the via is formed, it is seeded with a thin layer of nanocrystalline diamond (NCD) particles, and a NCD film is grown on the bottom and along the sidewalls of the via. The presence of the diamond-filled vias provides improved thermal management to semiconductor devices formed on the silicon substrate.

In some embodiments, the NCD layer is grown in the form of a thin film covering the surfaces of the via. In other embodiments the NCD is in the form of a thicker layer that substantially fills the via. In still other embodiments, the NCD-coated vias may be filled with metal to provide a composite structure.

If a sufficient number of NCD-coated vias is formed in the silicon substrate, the substrate effectively becomes a diamond substrate, with the substrate having the thermal benefits of solid diamond without the practical challenges associated with the growth of a single-crystal diamond chip.

DETAILED DESCRIPTION

The aspects and features summarized above can be embodied in various forms. The following description shows, by way of illustration, combinations and configurations in which those aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

As noted above, thermal management is of increasing importance in the design and manufacture of semiconductor devices.

Metal-filled through-silicon vias (TSVs) have been widely employed in advanced interconnect applications such as off-chip interconnect in multi-chip modules. See N. Ranganathan, L. Ebin, L. Linn, L. W. S. Vincent, O. K. Navas, V. Kripesh, and N. Balasubramanian, "Integration of High Aspect Ratio Tapered Silicon Via for Silicon Carrier Fabrication," IEEE Trans. on Adv. Packaging, vol. 32, no. 1, pp. 62, 2009.

Recognizing that a high thermal conductivity path is most needed in the immediate vicinity of the heat source in the device, the present invention addresses the thermal management problem in devices on a Si substrate by etching TSVs in the substrate and subsequently growing high thermal conductivity nanocrystalline diamond (NCD) in the etched patterns. NCD-coated TSVs in accordance with the present invention have the potential of providing electrically insulating thermal paths across semiconductor surfaces, and thus are of interest in semiconductor device thermal management applications, as devices fabricated on such a substrate experience improved thermal management.

Fundamental growth properties limiting the growth rate of diamond have historically limited one's ability to grow large volumes of diamond in such TSVs. In the NCD-coated TSVs in accordance with the present invention, the volumetric growth ratio of diamond is increased by providing a larger surface area on the substrate by increasing the packing density of the vias and the depth of each individual via.

As described in more detail below, in accordance with the present invention, an array of circular vias or square trenches can be etched into an Si substrate using an AlN/AlGaN nucleation layer as a selective etch stop. A high thermal conductivity nanocrystalline diamond (NCD) can then be grown in the vias. The NCD coats all surfaces of the via, and in some cases can extend along the surface of the silicon substrate to partially or completely cover the unetched surfaces of the substrate. If a sufficient number of NCD-coated vias is formed in the silicon substrate, the substrate's mechanical and thermal properties approach those of a diamond substrate, with the substrate having the thermal benefits of solid diamond without the practical challenges associated with the growth of a single-crystal diamond chip.

Figure 1:
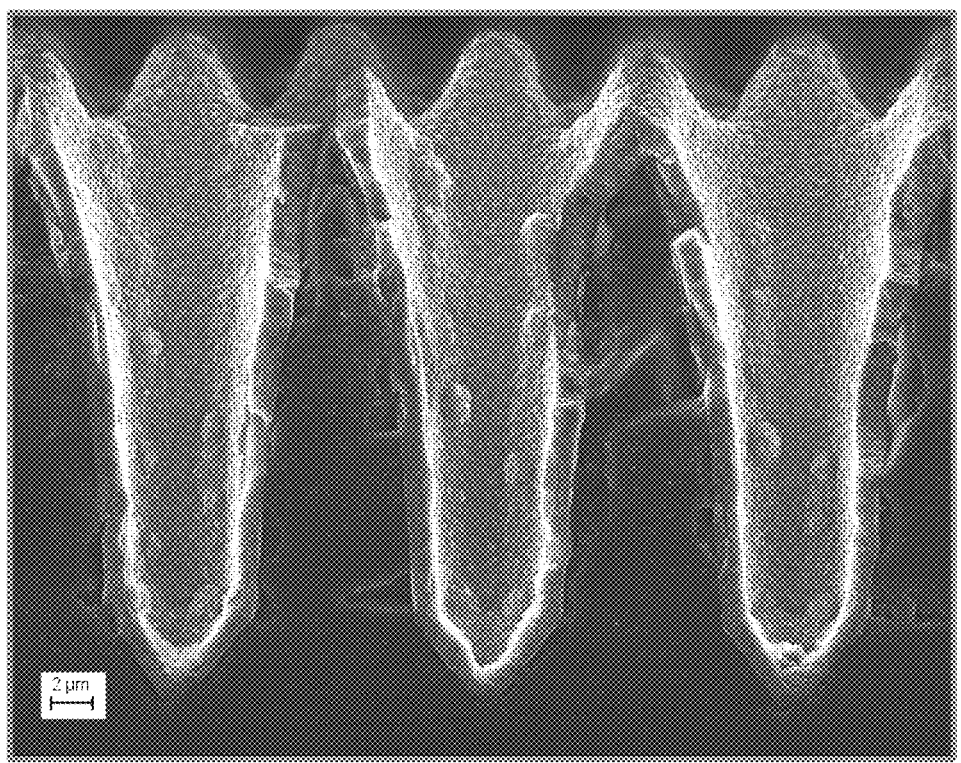
FIG. 1 is a scanning tunneling microscopy (SEM) image depicting a cross-sectional view of a silicon substrate having NCD-coated tapered through-silicon vias formed therein in accordance with one or more aspects of the present disclosure.

FIG. 1 is an SEM image depicting an exemplary array of NCD-coated TSVs in accordance with the present invention. As can be seen in the SEM image in FIG. 1 and as described in more detail below, in accordance with the present invention, the NCD-coated TSVs in accordance with the present invention can be tapered, so that the diameter of the via at the surface of the substrate is larger than the diameter of the via at its bottom. As described below, such tapering permits the growth of a more uniformly thick NCD coating along via sidewalls, enabling the via to be completely filled with diamond without causing air-filled voids midway into the via.

Figure 2:
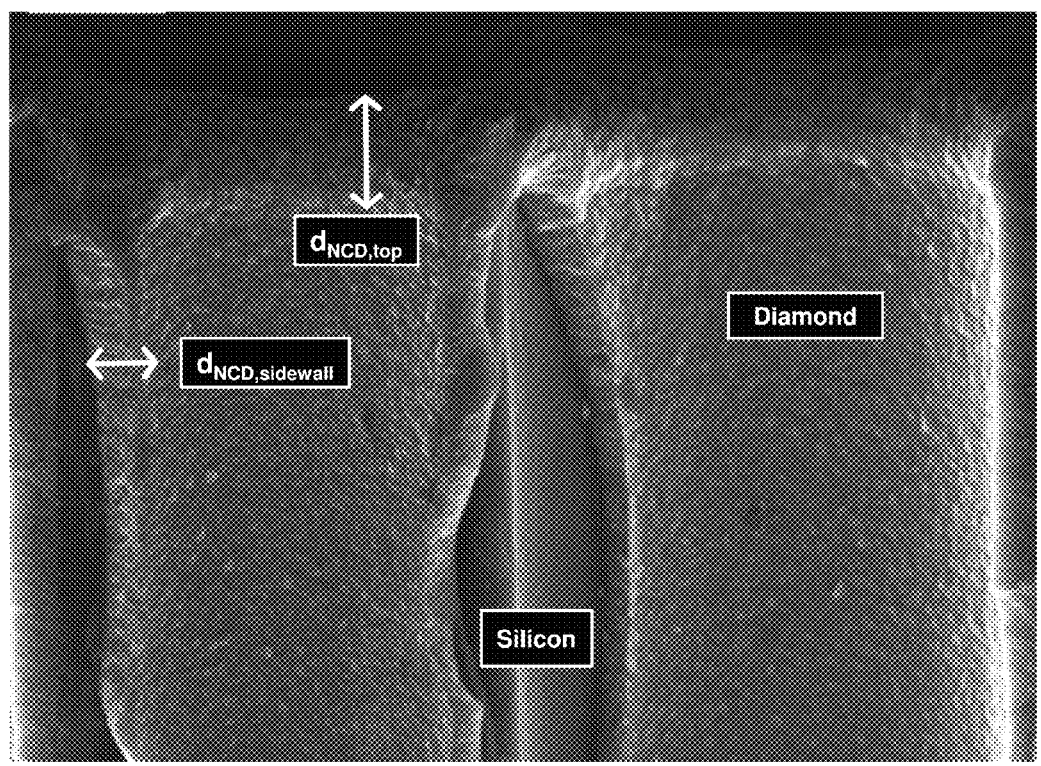
FIG. 2 is an SEM image depicting a higher-resolution cross-sectional view of a silicon substrate having NCD-coated tapered through-silicon vias formed therein in accordance with one or more aspects of the present disclosure.

FIG. 2 provides a more detailed, higher-resolution view of a cross-section of exemplary NCD-coated tapered TSVs in accordance with the present invention. As can be seen in FIG. 2, and as discussed in more detail below, the diamond coating covers not only the sidewalls of the via but also extends over its top edge and along the surface of the substrate, with the coating having a first thickness $d_{NCD,sidewall}$ along the sidewalls and a second thickness $d_{NCD,top}$ along the surface of the substrate at the top of the via. As described below, the ratio $d_{NCD,sidewall}/d_{NCD,top}$ of the side and top thicknesses can be is affected by the dimensions of the via and the growth conditions for the NCD coating.

In most cases, it is desirable for the NCD coating to have approximately the same thickness everywhere, i.e., for the ratio $d_{NCD,sidewall}/d_{NCD,top}$ to approach 1. Achieving such a uniform thickness in a via with straight sidewalls is difficult because the diamond is initially deposited at the top of the via, and so the thickness at the top of the via increases with each deposition cycle, eventually narrowing the opening at the top of the via and preventing further deposition along the sidewalls. However, by tapering the vias so that their sidewalls are made to open up towards the top instead of being perfectly vertical, more diamond can be deposited deeper into the vias, thus increasing the ratio of the sidewall NCD thickness to the topside thickness.

Figure 3A:
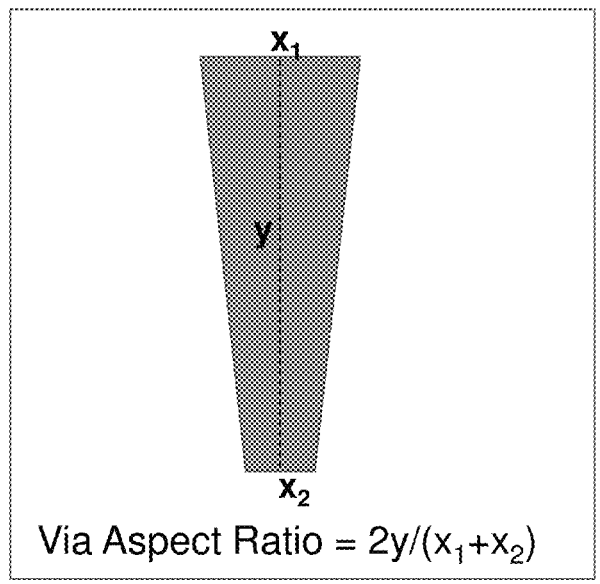
FIGS. 3A and 3B illustrate additional aspects of an NCD-coated tapered through-silicon via formed in accordance with the present invention.

FIG. 3A is a block diagram illustrating the geometry of a tapered via in accordance with the present invention. As illustrated in FIG. 3A, the aspect ratio of the via can be calculated from the dimensions of the via as $2y/(x_1+x_2)$, where y is the depth of the via, $x_1$ is the diameter at the substrate surface, and $x_2$ is the diameter of the via at its bottom. Increasing a via's depth causes less diamond to nucleate on the sidewalls of the via, necessitating an increase in $x_1$, and thus requiring a greater spacing between vias along the surface of the substrate. Thus, the vias should be formed with an aspect ratio such that they have a depth sufficient to penetrate deeply enough into the substrate in order to reach hot points near a device (or devices), while having a top-side diameter small enough to permit a high packing density of the vias in the substrate.

Figure 3B:
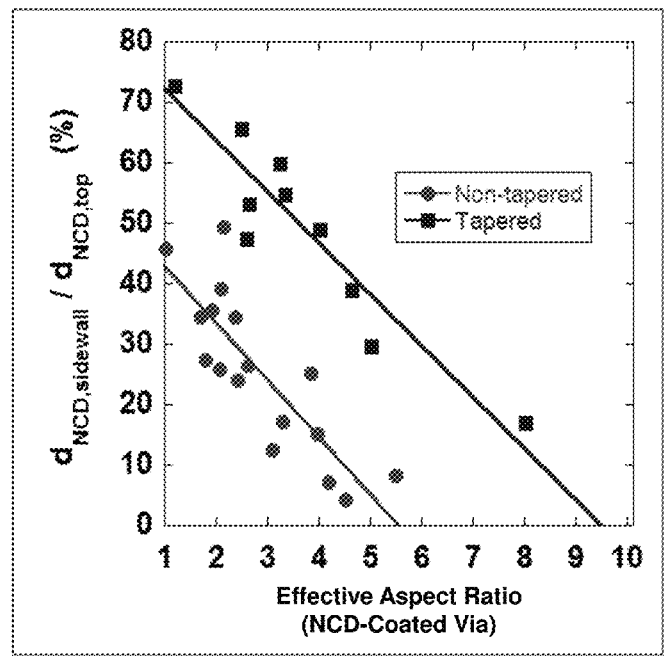

As noted above, tapering the vias permits the deposition of the NCD deeper into the via, bringing the $d_{NCD,sidewall}/d_{NCD,top}$ ratio closer to 1. The plot in FIG. 3B illustrates this point. This plot shows the change over time of the effective aspect ratio of the via, i.e., the aspect ratio of the NCD-coated via as the coating is deposited and shows how the effective aspect ratio becomes smaller as the ratio of sidewall NCD thickness to topside thickness increases.

As noted above, the diamond is deposited from the top side of the via and is deposited deeper into the via as the deposition time progresses. Thus, at the beginning of the deposition cycle, the ratio of NCD sidewall thickness to topside thickness is relatively low. As the diamond is deposited deeper into the via, the ratio of the NCD sidewall thickness to the topside thickness increases and effective aspect ratio of the diamond-coated via decreases. Eventually, the effective aspect ratio of the diamond-coated goes to 1, with the thickness of the NCD coating on the sidewalls at about 72% of the thickness of the coating on the topside, though it should be noted here that the thickness of the NCD coating can vary widely depending on the process conditions used. As can be seen in the plot, this occurs in a tapered via having an initial effective aspect ratio of about 9.5 a $d_{NCD,sidewall}/d_{NCD,top}$ ratio of zero (i.e., no diamond on the sidewalls). Thus, the plot in FIG. 3B shows that it is possible to fully coat (sidewalls and bottom) a via having an uncoated aspect ratio of up to 9.5.

As also can be seen from the plot in FIG. 3B, at any given aspect ratio, the percentage of sidewall to top-side NCD thickness is higher for tapered vias than for non-tapered ones. This is because both the nanodiamond seed during the seeding stage and the CVD gas during the diamond growth stages have a higher probability of species penetration into the via in a tapered via than a non-tapered one for the reasons noted above.

The pressure under which the NCD coating is grown can also affect the growth of the NCD on the via top and sidewalls. As described below, growing the NCD coating at a lower pressure improves species penetration into the via, resulting in a more uniform coating even in vias with a higher initial aspect ratio.

Figures 4A, 4B:
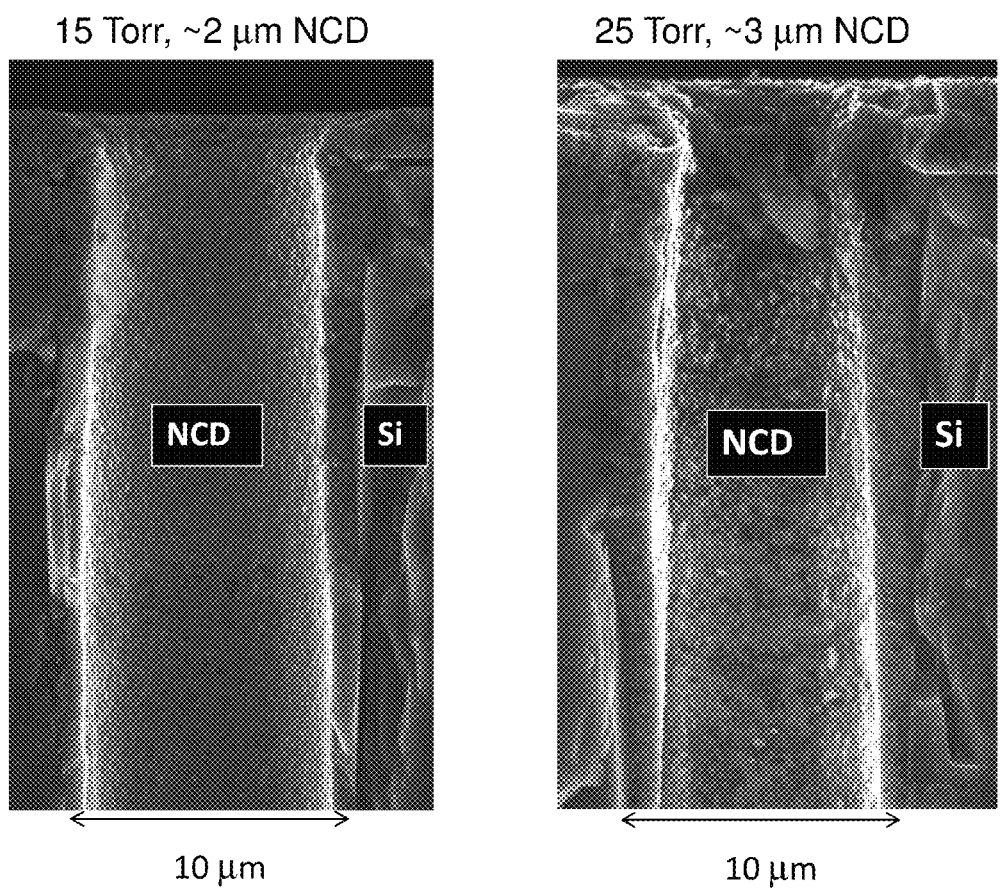
FIGS. 4A and 4B are SEM images of NCD-coated tapered through-silicon vias formed at different pressures and illustrate the effect of growth pressure on the thickness of the NCD coating.

FIGS. 4A and 4B are SEM images showing cross-sections of NCD-coated tapered TSVs formed in accordance with the present invention under two different NCD growth conditions. The NCD coating shown in FIG. 4A had a nominal thickness of 2 µm and was grown under a pressure of 15 Torr, while the coating shown in FIG. 4B had a nominal thickness of 3 µm and was grown under a pressure of 25 Torr. As can be seen from the images in FIGS. 4A and 4B, the NCD coating deposited at the lower 15 Torr pressure has a more uniform thickness along the top and sidewalls than does the NCD coating deposited at the higher 25 Torr pressure.

Figure 5A:
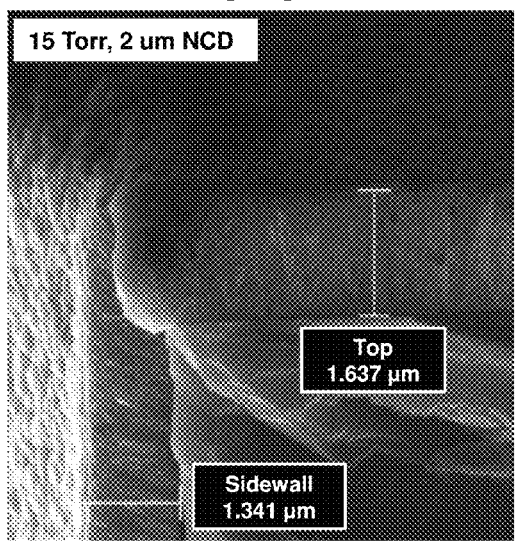
FIGS. 5A-5C further illustrate the effect of pressure on the top and sidewall thickness of an NCD coating formed on a tapered through-silicon via in accordance with the present disclosure.
Figure 5B:
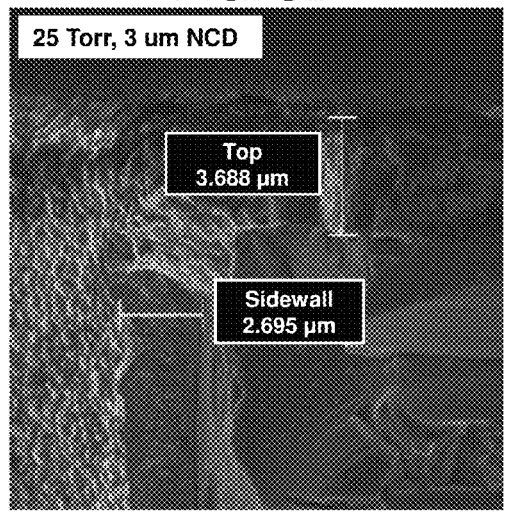
Figure 5C:
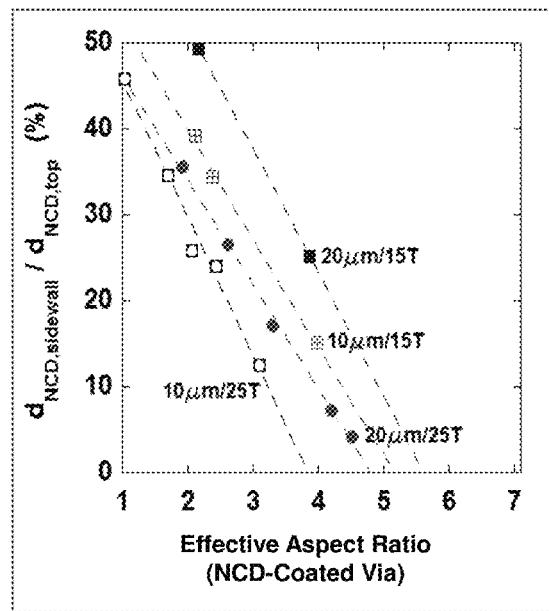

FIGS. 5A-5C further illustrate this point. FIGS. 5A and 5B are enlarged views of the NCD-coated vias shown in FIGS. 4A and 4B. Thus, as shown in FIG. 5A, an NCD coating having a nominal thickness of 2 µm grown under a pressure of 15 Torr has a sidewall thickness of 1.341 µm and a topside thickness of 1.637 µm, for a side-to-top thickness ratio of 82%; in contrast, as shown in FIG. 5B, an NCD coating having a nominal thickness of 3 µm grown on the surfaces of a tapered via under a pressure of 25 Torr has a sidewall thickness of 2.695 µm and a top thickness of 3.688 µm for a side-to-top thickness ratio of 73%.

The plots in FIG. 5C further illustrate the effect of growth pressure on the relative thickness of the NCD coating on the top and sidewalls of the via. As with the plot in FIG. 3B, the plot in FIG. 5C (which shows a subset of the data in FIG. 3B) shows that the effective aspect ratio of the NCD-coated via decreases as more diamond is deposited on the sidewalls of the via during the growth process. As can also be seen from the plots in FIG. 5C, for any nominal thickness of the NCD coating, the coating is more uniform along the sidewalls and the top when deposition is done at a lower pressure. In addition, at such lower pressures, a more uniform coating can be obtained on vias having a wider diameter. Thus, it can be seen that for a non-tapered via with a diameter of 20 µm, the coating is much more uniform ($d_{NCD,sidewall}/d_{NCD,top}$ is higher) and effective aspect ratio of the NCD-coated via is higher than that of a via with a diameter of 10 µm, grown under identical pressures. The effect of lowering the pressure is similar: coating deposited at 15 Torr had a better sidewall uniformity than one deposited at 25 Torr.

The present invention also provides methods for forming the tapered NCD-coated TSVs.

For an application to a substrate with an epitaxial III-Nitride film, we must first consider the trivial case of thinning or completely etching away the Si substrate. While this can be done relatively easily on a non-stressed substrate such as Si, thinning a wafer with a strained III-Nitride film will increase the bowing factor, limiting the device real estate on the wafer and potentially leading to strain relaxation in the GaN film. Azize et al. have shown that a Si substrate with a total of 1.8 um III-Nitride growth (including the nucleation layer) can be thinned from 500 um down to 350 um thickness before stress-relieving cracks can be observed on the GaN surface. See M. Azize and T. Palacios, "Effect of substrate-induced strain in the transport properties of AlGaN/GaN heterostructures," *J. Appl. Phys.* 108, 023707 (2010). Our objective was to contact the GaN with a diamond surface from the back side, as has been similarly demonstrated in a top-side diamond capping process directly on GaN. See Tadjer et al. 2012, supra. As a result, one must not only partially etch the Si substrate but also ensure in doing so that sufficient structural support for the GaN layer will be maintained, while maximizing diamond packing volume and minimizing diamond growth time.

We then consider the etching of the vias and the deposition of the diamond therein.

The present invention utilizes a two-step process. First, tapered vias are etched in the Si substrate by means of an inductively-coupled plasma (ICP) process. An NCD film is then grown in the etched vias using a chemical vapor deposition (CVD) process. In both parts of the fabrication process, multi-step process optimization is utilized to control the shape of the via and the subsequent diamond profile.

Thus, in exemplary embodiments in accordance with the present invention, TSVs are etched in samples of (111) Si using a $SiO_2$ mask in a cryogenic inductively-coupled plasma dry etch process with $SF_6$ being used as an etchant. As noted below, the etching is conducted so that the vias are tapered, with the diameter of the via at the surface of the Si being larger than the diameter of the via at its bottom. The etch rate was highly dependent on via diameter and exposed Si area. However, depth/diameter aspect ratios of up to 18 were routinely obtained with up to 1 hour etch time.

Due to limitations in plasma species diffusion during etching, a chemistry for forming a tapered via angle needs to be applied. See Ranganathan, supra. By adding a small concentration of $O_2$ in the Si-etching $SF_6$ gas, an additional $SiO_2$ film will grow near the via openings, and its subsequent etching will taper the via profile angle. Thus, vias with pre-etched vertical sidewalls in a pure $SF_6$ ICP chemistry can be tapered by a second etch step in $SF_6/O_2$ chemistry. Those skilled in the art will appreciate that there are a number of processing conditions possible for this optimization step, and the results will be highly dependent on the processing equipment used. Id.

A process for via etch stop using $SiO_2$ was also developed and can be used to restrict via depth regardless of the geometry of the via because $SF_6$-based chemistry has a higher etch rate of Si as compared to that of $SiO_2$. Using $SF_6$-based plasma etching in accordance with the present invention allows for the etching of vias having several different sizes and/or shapes to the same depth in a single Si wafer. Other materials, such as AlN or $Al_2O_3$, can also be used towards the same purpose.

The substrate samples with the tapered TSVs formed therein are subsequently cleaned and the tapered TSVs are seeded with nanodiamond particles. NCD films are then grown from the seeded particles using microwave plasma enhanced CVD. A brief summary of the NCD growth process is set forth below. Additional details regarding the NCD growth process can be found in U.S. Pat. No. 8,445,383, which shares several inventors in common with the present invention, the entirety of which is hereby incorporated by reference into the present disclosure.

Thin NCD films are nucleated on a clean substrate surface by first depositing a "seed" layer of nanocrystalline diamond particles ranging size from 1 to 10 nm diameter. The nanocrystalline diamond particles are synthesized by detonation processes and are widely available in powder form.

The deposition of the nanodiamond particles proceeds with first baking the powder in a furnace under reduced pressure of 1-100 torr under an atmosphere of flowing hydrogen with a flow of 1-500 standard cubic centimeters per minute. With the nanocrystalline diamond powder exposed to these conditions the temperature is slowly raised from room temperature to near 400 degrees Celsius but can be as low as 200 degrees Celsius and as high as 750 degrees Celsius.

This process prepares the nanocrystalline diamond powder for the next step, which is suspension in an alcohol containing solution such as methyl alcohol, ethyl alcohol, isopropyl alcohol and other polar solvents. The concentration of nanocrystalline diamond in the solution is typically 5 grams per liter but can range from 1 gram per liter up to 10 grams per liter. The suspension is formed by high power ultrasonic treatment of the solution after mixing nanocrystalline diamond with the alcohol solution. The solution is cooled during the ultrasonic agitation to minimize agglomeration of the particles in the suspension. The power ranges from 500 to 1000 watts and is pulsed on for durations of 1 to 3 seconds and off for 1-3 seconds for a total treatment time of 60 to 120 minutes.

Following high power ultrasonic treatment the solution is allowed to settle and is then decanted and the remaining sludge is discarded or measured to quantify the true concentration on nanocrystalline diamond powder in the solution.

The solution is used for deposition of a thin layer, typically one or two layers, of nanocrystalline diamond particles using the following process: The suspension solution is continuously agitated in a low power ultrasonic bath with integral cooling to keep the suspension below room temperature. The clean substrate is immersed in the suspension solution and is suspended in the solution for a time ranging from 1 to 100 minutes. Following this step, the substrate is suspended in a clean alcohol solution with or without ultrasonic agitation to remove excess nanocrystalline diamond particles. Following this rinsing procedure, the wafer can be placed on a spin drying tool and further rinsed while spinning at low rpm ranging from 50 to 500 rpm. The substrate is continuously sprayed with a rinsing alcohol solution during this time. Following rinsing, the rotation rate is increased to 1000 to 5000 rpm to dry the substrate leaving a very high density of nanocrystalline particles in a thin layer. The density of seed particles can range from $10^{11}$ to $10^{13}$ particles per square centimeter.

Of course, one skilled in the art would readily understand that other etching techniques and etching conditions can be used to form the vias and clean the substrate, and all such other techniques and conditions are deemed to be within the scope of the present disclosure.

The substrate with the vias formed therein is then ready for growth of the nanocrystalline diamond thin film.

The NCD film growth may be carried out at temperatures between about 450° C. and about 1000° C. Growth will typically be in a microwave plasma CVD system with a methane and hydrogen atmosphere at pressures typically 15 torr and between 5 and 50 torr, but growth using other processes and/or under other conditions may be possible and such other growth processes and/or conditions are all deemed to be within the scope of the present disclosure. The concentration of methane is typically between 0.1 and 10% to produce very high quality nanocrystalline diamond films. The plasma frequency is typically 2.45 GHz Pinhole-free thin NCD film thickness can range from 50 nanometers to more than 100 micrometers.

The thus-grown NCD coating is conformal and covers any small shapes and features on the arbitrary substrate and in the via. In some embodiments, the NCD can be in the form of a thin film having a nominal thickness of 2-3 µm on the sidewalls and top of the via while in other embodiments, the NCD can be a thicker layer that can fill the via to form a substantially solid diamond structure in the Si substrate.

Examples

Tapered TSVs were etched in samples of (111) Si using a $SiO_2$ mask in a cryogenic inductively-coupled plasma reactive ion etching (ICP/RIE) dry etch process under the following conditions: 150 standard cubic centimeters per minute (sccm) SF$_6$, 10 sccm O$_2$, inductively-coupled plasma (ICP) power of 1000 W, reactive-ion etch power (RIE) of 9 W, process temperature of −100° C., and a chamber pressure of 41.5 mT.

The etch rate was highly dependent on via diameter (5-20 μm) and exposed Si area (5-95%). However, depth/diameter aspect ratios of up to 18 were routinely obtained with up to 1 hour etch time.

The samples with vias etched using the above described processing conditions were subsequently cleaned and the tapered vias were seeded with 5-25 nm diameter nanodiamond particles. NCD films with 2-3 μm nominal thickness were grown by microwave plasma enhanced CVD at 750° C. NCD growth was characterized by scanning electron microscopy and Raman spectroscopy as a function of CVD growth conditions and TSV lateral and vertical geometry.

In some embodiments, the diamond can be grown to a thickness that substantially or completely fills the via. This embodiment maximizes the thermal and structural benefit of the integration of this material. In other embodiments, the diamond-coated via can be filled with a conductive material such as a metal. In this embodiment, a thermally-conductive but electrically-insulating via and be made electrically conductive via the metal fill. This interconnection path will be insulated from the substrate via the electrically insulating diamond coating. In addition, in some cases, the diamond can extend above the top edge of the via to coat a portion of the surface of the silicon substrate surrounding the via opening.

Figure 6A:
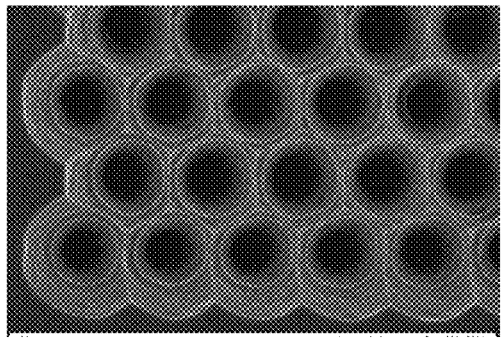
FIGS. 6A-6F are SEM images illustrating various configurations of silicon substrates having multiple NCD-coated tapered vias formed therein in accordance with the present disclosure.
Figure 6B:
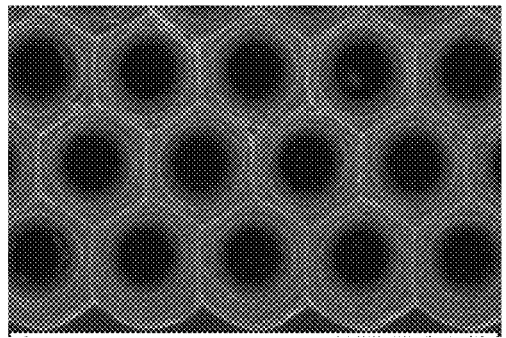
Figure 6C:
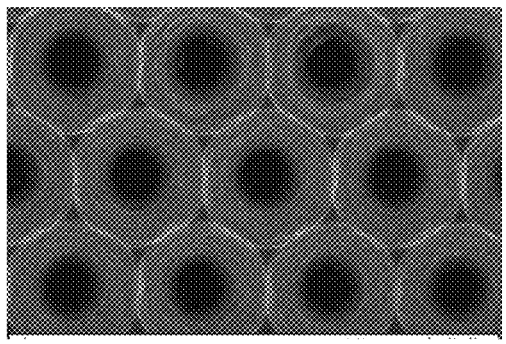
Figure 6D:
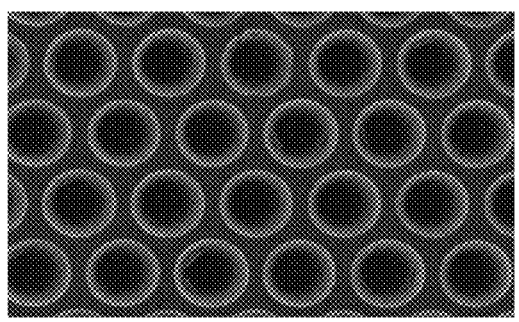
Figure 6E:
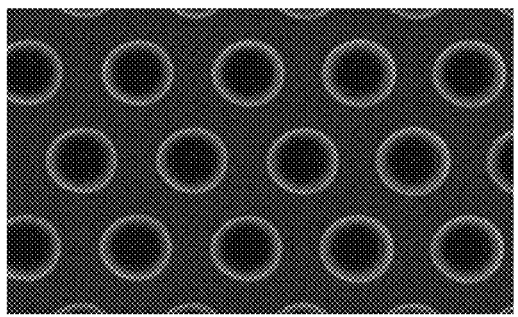
Figure 6F:
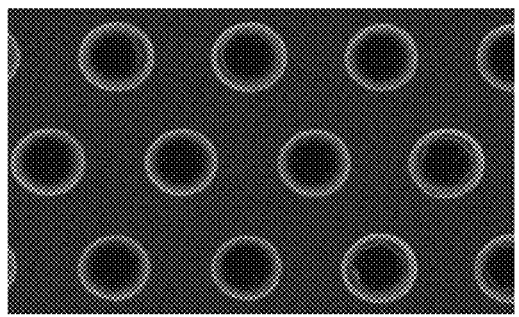

Thus, in accordance with the present invention, an array of NCD-coated vias such as those illustrated in FIGS. 6A-6F can be formed in a silicon substrate. As illustrated in FIGS. 6A-6C, in some embodiments, the NCD-coated vias can be formed in a close-packed hexagonal arrangement in order to maximize the number of vias per substrate area; such an arrangement effectively provides a localized diamond substrate without the small size and high cost of a single-crystal diamond substrate. In other embodiments such as those illustrated in FIGS. 6D-6F, the vias can be deeper and more widely spaced.

Figure 7:
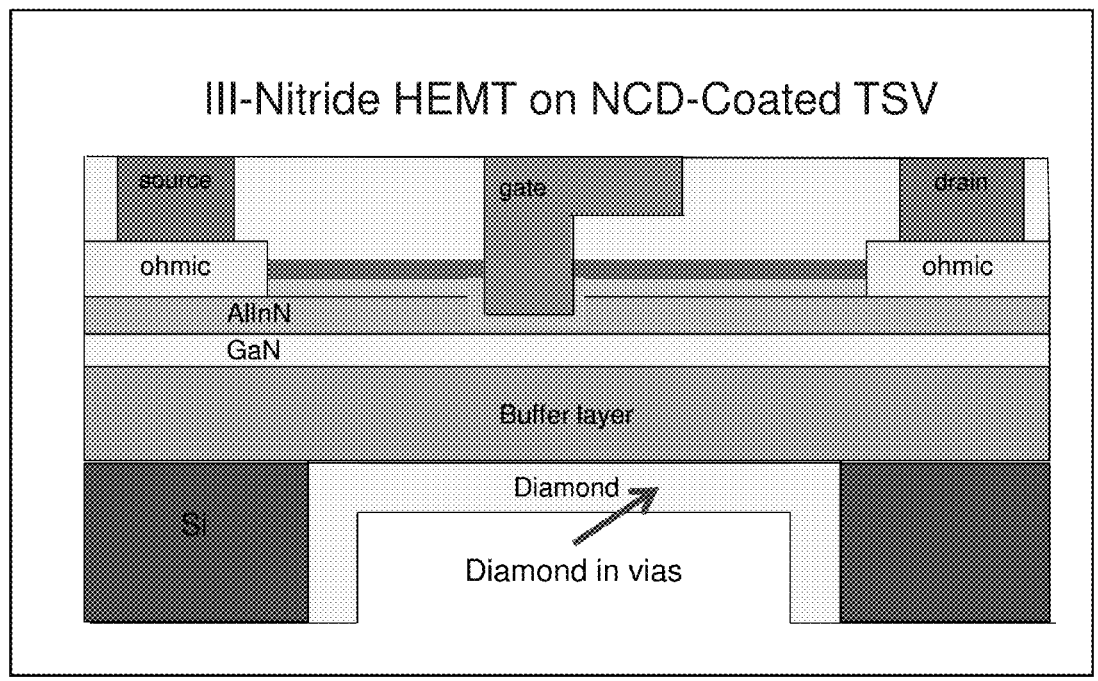
FIG. 7 is a block diagram illustrating aspects of an exemplary semiconductor device formed on a silicon substrate having an NCD-coated tapered through-silicon via formed therein in accordance with the present disclosure.

Once an NCD-coated via is formed in the silicon substrate, a semiconductor device such as the III-Nitride high electron mobility transistor (HEMT) illustrated in FIG. 7 can be fabricated at the closed end of the via. Such a structure is easily scalable, so that in the case where multiple vias are formed in a sheet, multiple devices can be formed, each at the closed end of its respective via.

The use of diamond films grown on top of an electrical device has been shown to improve performance, see T. J. Anderson, K. D. Hobart, M. J. Tadjer, T. I. Feygelson, E. A. Imhoff, D. J. Meyer, D. S. Katzer, J. K. Hite, F. J. Kub, B. B. Pate, S. C. Binari, and C. R. Eddy, Jr., "Improved GaN-based HEMT Performance by Nanocrystalline Diamond Capping," *Device Research Conference Digest*, pp. 155-156, 2012; and A. Wang, M. J. Tadjer, T. J. Anderson, R. Baranyai, J. Pomeroy, T. I. Feygelson, K. D. Hobart, B. B. Pate, F. Calle, and M. Kuball, "Impact of Intrinsic Stress in Diamond Capping Layers on the Electrical Behavior of AlGaN/GaN HEMTs," *IEEE Trans. Electr. Dev.*, vol. 60, no. 10, pp. 3149-3156, 2013, and it is highly possible that the use of diamond-filled TSVs in accordance with the present invention will similarly achieve improvements in the performance of electrical devices fabricated thereon over devices formed on a simple silicon substrate.

For example, as illustrated in the Table shown below, diamond has a critical electric field of 5.6 MV/cm, nearly 18 times higher than that of silicon.

|  | Si | GaN | Diamond |
|---|---|---|---|
| Bandgap (eV) | 1.1 | 3.49 | 5.5 |
| Critical Electric Field (MV/cm) | 0.3 | 3.3 | 5.6 |
| Thermal Conductivity | 110 | 180 | 1000-2000 |

As a result, devices formed on an NCD-coated via in silicon may exhibit improved breakdown voltage as compared to other similar devices.

Advantages and New Features

Efficient thermal management is of paramount importance to the commercialization of III-Nitride power transistors on Si substrates. The present invention provides a process for efficient diamond growth inside through-Si vias for thermal management of power transistors on Si substrates.

Applied to thermal management of GaN-based transistors, the method according to the present invention and the NCD-coated vias produced thereby have provide a substrate-side thermal management solution that avoids critical process steps such as blanket substrate removal. Such NCD-coated vias in accordance with the present invention can keep the substrate wafer within wafer bow specifications while also freeing the device side of the wafer from thermal management related process steps and so may improve device scaling.

Alternatives

The diamond-filled vias in accordance with the present invention can be implemented in many ways.

For example, although growth of NCD in tapered vias has been described above, it is also possible to grow diamond in non-tapered vias, i.e., vias having equal top and bottom diameters, so long as the aspect ratio of the via is sufficient to permit the growth of the diamond along its sidewalls as well as its topside.

In some embodiments, the vias can be circular or substantially circular, while in other embodiments the vias can have a square, rectangular, or other regular or irregular shape.

As described above, in some embodiments, the vias are arranged in the substrate in a close-packed hexagonal pattern, but they can also be arranged in a rectangular or other pattern, or even randomly, on the substrate, as may be appropriate for the particular application.

In some embodiments, the NCD coating can be formed using process temperatures within the thermodynamic stability window of the materials forming the device for which the vias are configured, e.g., at temperatures of less than 900° C. for GaN devices.

Although particular embodiments, aspects, and features have been described and illustrated, it should be noted that the invention described herein is not limited to only those embodiments, aspects, and features, and it should be readily appreciated that modifications may be made by persons skilled in the art. The present application contemplates any and all modifications within the spirit and scope of the underlying invention described and claimed herein, and all such embodiments are within the scope and spirit of the present disclosure.

What is claimed is:

1. A nanocrystalline diamond-impregnated silicon substrate, comprising:

a plurality of through-silicon vias formed in the substrate, each of the through-silicon vias having a sidewall extending into the silicon substrate and a top edge at the surface of the silicon substrate;
wherein at least some of the through-silicon vias have a nanocrystalline diamond (NCD) coating on the sidewalls and bottom thereof; and
wherein the NCD-coated through-silicon vias are arranged in a predetermined pattern in the substrate that increases the volumetric growth rate of nanocrystalline diamond.

2. The nanocrystalline diamond-impregnated silicon substrate according to claim 1, wherein the through-silicon vias are tapered such that each via has a first diameter at a top edge of the through-silicon via at a surface of the silicon substrate and a second diameter smaller than the first diameter at a bottom of the through-silicon via within the silicon substrate.

3. The nanocrystalline diamond-impregnated silicon substrate according to claim 1, wherein the NCD coating further extends above a top edge of at least one of the NCD-coated through-silicon vias and along a portion of the surface of the substrate, the NCD coating has a first thickness along the sidewall of the through-silicon via and a second thickness along the surface of the substrate.

4. The nanocrystalline diamond-impregnated silicon substrate according to claim 1, wherein the NCD coating has a predetermined ratio of thickness at a topside of the through-silicon via to thickness along sidewalls of the through-silicon via.

5. The nanocrystalline diamond-impregnated silicon substrate according to claim 1, wherein a thickness of the NCD coating is substantially the same at a top edge and along sidewalls of the through-silicon via.

6. A nanocrystalline diamond-impregnated silicon substrate, comprising:
a plurality of through-silicon vias formed in the substrate, each of the through-silicon vias having a sidewall extending into the silicon substrate and a top edge at the surface of the silicon substrate;
wherein at least some of the through-silicon vias have a nanocrystalline diamond (NCD) coating on the sidewalls thereof, a thickness of the NCD coating being such that the through-silicon via is substantially filled with diamond; and
wherein the NCD-coated through-silicon vias are arranged in a predetermined pattern in the substrate.

7. The nanocrystalline diamond-impregnated silicon substrate according to claim 6, wherein the through-silicon vias are tapered such that each via has a first diameter at a top edge of the through-silicon via at a surface of the silicon substrate and a second diameter smaller than the first diameter at a bottom of the through-silicon via within the silicon substrate.

8. The nanocrystalline diamond-impregnated silicon substrate according to claim 6, wherein the NCD coating further extends above a top edge of at least one of the NCD-coated through-silicon vias and along a portion of the surface of the substrate, the NCD coating has a first thickness along the sidewall of the through-silicon via and a second thickness along the surface of the substrate.

9. The nanocrystalline diamond-impregnated silicon substrate according to claim 6, wherein the NCD coating has a predetermined ratio of thickness at a topside of the through-silicon via to thickness along sidewalls of the through-silicon via.

10. The nanocrystalline diamond-impregnated silicon substrate according to claim 6, wherein a thickness of the NCD coating is substantially the same at a top edge and along sidewalls of the through-silicon via.

11. A nanocrystalline diamond-impregnated substrate, comprising:
a plurality of through-silicon vias formed in a (111) silicon substrate, each of the through-silicon vias having a sidewall extending into the substrate and onto a top edge at the surface of the substrate;
wherein at least some of the through-silicon vias have a nanocrystalline diamond (NCD) coating on the sidewalls thereof; and
wherein the NCD-coated through-silicon vias are arranged in a predetermined pattern in the substrate.

12. The nanocrystalline diamond-impregnated silicon substrate according to claim 11, wherein the through-silicon vias are tapered such that each via has a first diameter at a top edge of the through-silicon via at a surface of the silicon substrate and a second diameter smaller than the first diameter at a bottom of the through-silicon via within the silicon substrate.

13. The nanocrystalline diamond-impregnated silicon substrate according to claim 11, wherein the NCD coating further extends above a top edge of at least one of the NCD-coated through-silicon vias and along a portion of the surface of the substrate, the NCD coating has a first thickness along the sidewall of the through-silicon via and a second thickness along the surface of the substrate.

14. The nanocrystalline diamond-impregnated silicon substrate according to claim 11, wherein the NCD coating has a predetermined ratio of thickness at a topside of the through-silicon via to thickness along sidewalls of the through-silicon via.

15. The nanocrystalline diamond-impregnated silicon substrate according to claim 11, wherein a thickness of the NCD coating is substantially the same at a top edge and along sidewalls of the through-silicon via.

16. A nanocrystalline diamond-impregnated silicon substrate, comprising:
a plurality of through-silicon vias formed in the substrate, each of the through-silicon vias having a sidewall extending into the silicon substrate and a top edge at the surface of the silicon substrate;
wherein at least some of the through-silicon vias have a nanocrystalline diamond (NCD) coating on the sidewalls thereof; and
wherein the NCD-coated through-silicon vias are arranged in a predetermined hexagonal array within the substrate.

17. The nanocrystalline diamond-impregnated silicon substrate according to claim 16, wherein the through-silicon vias are tapered such that each via has a first diameter at a top edge of the through-silicon via at a surface of the silicon substrate and a second diameter smaller than the first diameter at a bottom of the through-silicon via within the silicon substrate.

18. The nanocrystalline diamond-impregnated silicon substrate according to claim 16, wherein the NCD coating further extends above a top edge of at least one of the NCD-coated through-silicon vias and along a portion of the surface of the substrate, the NCD coating has a first thickness along the sidewall of the through-silicon via and a second thickness along the surface of the substrate.

19. The nanocrystalline diamond-impregnated silicon substrate according to claim 16, wherein the NCD coating has a predetermined ratio of thickness at a topside of the through-silicon via to thickness along sidewalls of the through-silicon via.

20. The nanocrystalline diamond-impregnated silicon substrate according to claim 16, wherein a thickness of the NCD coating is substantially the same at a top edge and along sidewalls of the through-silicon via.

* * * * *